United States Patent
Hirose et al.

(10) Patent No.: US 10,074,763 B2
(45) Date of Patent: Sep. 11, 2018

(54) SOLAR CELL

(71) Applicant: Panasonic Intellectual Property Management Co., Ltd., Osaka-shi, Osaka (JP)

(72) Inventors: Koichi Hirose, Daito (JP); Yoshihiro Matsubara, Daito (JP); Kunihiro Kawamoto, Daito (JP)

(73) Assignee: PANASONIC INTELLECTUAL PROPERTY MANAGEMENT CO., LTD., Osaka-shi (JP)

( * ) Notice: Subject to any disclaimer, the term of this patent is extended or adjusted under 35 U.S.C. 154(b) by 177 days.

(21) Appl. No.: 15/146,527

(22) Filed: May 4, 2016

(65) Prior Publication Data

US 2016/0247954 A1 Aug. 25, 2016

Related U.S. Application Data (63) Continuation of application No. PCT/JP2014/005276, filed on Oct. 17, 2014.

(30) Foreign Application Priority Data

Nov. 8, 2013 (JP) ................................. 2013-232346

(51) Int. Cl.
*H01L 31/0747* (2012.01)
*H01L 31/075* (2012.01)
(Continued)

(52) U.S. Cl.
CPC .......... *H01L 31/075* (2013.01); *H01L 31/028* (2013.01); *H01L 31/022466* (2013.01);
(Continued)

(58) Field of Classification Search
CPC .................................................. H01L 31/0747
See application file for complete search history.

(56) References Cited

U.S. PATENT DOCUMENTS

| 5,935,344 A | 8/1999 | Endo et al. |
| 2012/0108002 A1 | 5/2012 | Lee et al. |

(Continued)

FOREIGN PATENT DOCUMENTS

| EP | 2765615 A1 | 8/2014 |
| JP | 9-129904 A | 5/1997 |

(Continued)

OTHER PUBLICATIONS

Extended (Supplementary) European Search Report (EESR) dated Oct. 18, 2016, issued in counterpart European Patent Application No. 14860072.9. (7 pages).

(Continued)

*Primary Examiner* — Magali P Slawski
(74) *Attorney, Agent, or Firm* — Westerman, Hattori, Daniels & Adrian, LLP (57) ABSTRACT

A solar cell is provided with: a crystal substrate having n-type conductivity type as one conductivity type; an n-type semiconductor layer—that is continuously laminated from a light receiving surface, i.e., one main surface of the crystal substrate, and a side surface of the crystal substrate; a p-type semiconductor layer, which is continuously laminated from a rear surface, i.e., the other main surface of the crystal substrate, and the side surface of the crystal substrate, and which has at least one part thereof overlapping, on the side surface of the crystal substrate, the n-type semiconductor layer; a light receiving surface-side transparent conductive film, which is, on the light receiving surface of the crystal substrate, laminated to the n-type semiconductor layer, and which has a smaller area than a planar shape of the crystal substrate; and a rear surface-side transparent conductive film laminated to the p-type semiconductor layer.

5 Claims, 3 Drawing Sheets

(51) Int. Cl.
    *H01L 31/0224*   (2006.01)
    *H01L 31/028*    (2006.01)
    *H01L 31/0376*   (2006.01)

(52) U.S. Cl.
    CPC .... *H01L 31/03762* (2013.01); *H01L 31/0747* (2013.01); *Y02E 10/50* (2013.01)

(56) References Cited

U.S. PATENT DOCUMENTS

| | | |
|---|---|---|
| 2015/0075601 A1 | 3/2015 | Adachi et al. |
| 2015/0214398 A1 | 7/2015 | Watahiki et al. |

FOREIGN PATENT DOCUMENTS

| | | |
|---|---|---|
| JP | 11-251609 A | 9/1999 |
| JP | 2001-44461 A | 2/2001 |
| JP | 2011-23759 A | 2/2011 |
| JP | 2011-46990 A | 3/2011 |
| JP | 2011-60971 A | 3/2011 |
| JP | 2012-94861 A | 5/2012 |
| WO | 2012/059878 A1 | 5/2012 |
| WO | 2013/161127 A1 | 10/2013 |
| WO | 2014/034677 A1 | 3/2014 |

OTHER PUBLICATIONS

Notification of Transmittal of Translation of the International Preliminary Report on Patentability (Form PCT/IB/326) of International Patent Application No. PCT/JP2014/005276 dated May 19, 2016, with Forms PCT/IB/373 and PCT/ISA/237. (13 pages).

International Search Report dated Nov. 11, 2014, issued in counterpart International Application No. PCT/JP2014/005276 (2 pages).

SOLAR CELL

CROSS-REFERENCE TO RELATED APPLICATION

The present application is a continuation under 35 U.S.C. § 120 of PCT/JP2014/005276, filed Oct. 17, 2014, which is incorporated herein by reference and which claimed priority to Japanese Patent Application No. 2013-232346 filed Nov. 3, 2013. The present application likewise claims priority under 35 U.S.C. § 119 to Japanese Patent Application No. 2013-232346 filed Nov. 8, 2013, the entire content of which is also incorporated herein by reference.

TECHNICAL FIELD

The present disclosure relates to a solar cell.

BACKGROUND ART

Patent Literature 1 discloses a structure in which the semiconductor layer on the front surface side is formed over almost the whole surface of a substrate, and the semiconductor layer on the rear surface side is formed in an area smaller than the area of the substrate, in order to reduce the degradation of properties of a photovoltaic element due to the semiconductor layers on the front and rear surfaces wrapping around the end surface.

Patent Literature 2 discloses that, when in a photovoltaic element, for example, an n-type semiconductor layer is formed on a first main surface of an n-substrate, and a p-type semiconductor layer is formed on a second main surface, an n-substrate-n-layer-p-layer rectifying junction or an n-substrate-p-layer-n-layer reverse junction is formed on the side surface and the peripheral ends of the n-substrate, depending on the formation sequence of the semiconductor layers differing from each other in conductivity type. As stated in Patent Literature 2, the formation performed so as to form the former n-substrate-n-layer-p-layer rectifying junction results in the provision of a rectifying junction over the whole area of the substrate, and avoids the occurrence of adverse effects such as the suppression of the carrier transfer due to reverse junction.

CITATION LIST

Patent Literature

Patent Literature 1
  Japanese Patent Laid-Open Publication No. 2001-044461
Patent Literature 2
  Japanese Patent Laid-Open Publication No. Hei 11-251609

SUMMARY OF INVENTION

Technical Problem

As described in PATENT LITERATURES 1 and 2, if the semiconductor layer or a transparent conductive film is wrapping around at a side surface of a crystal substrate, a leak may possibly occur. If a mask is used to make each of the semi-conductor layer and the transparent conductive film have an area smaller than the crystal substrate in order to prevent leakage from occurring, an output power of the solar cell is reduced.

That is, even if the semiconductor layer or the like is wrapping around to the side surface of the crystal substrate, occurrence of leakage is required to be prevented while improving the output power of the solar cell.

Solution to Problem

A solar cell according to an aspect of the present disclosure comprises a crystal substrate which has one conductivity type, a first semiconductor layer which is continuously laminated on one main surface of the crystal substrate and a side surface of the crystal substrate and has one conductivity type, a second semiconductor layer which is continuously laminated on the other main surface of the crystal substrate and the side surface of the crystal substrate, and has the other conductivity type, at least a part of the second semiconductor layer overlapping the first-semiconductor layer at the side surface of the crystal substrate, a first transparent conductive film which is laminated on the first semiconductor layer over one main surface of the crystal substrate and has an area smaller than a planar shape of the crystal substrate, and a second transparent conductive film which is laminated on the second semiconductor layer.

Advantageous Effect of Invention

According to an aspect of the present disclosure, even if a semiconductor layer or the like is wrapping around to a side surface of a crystal substrate, leak occurrence can be prevented while improving an output power of a solar cell.

BRIEF DESCRIPTION OF DRAWINGS

FIG. 1 is a diagram showing a solar cell in an embodiment in which FIG. 1(a) is a cross sectional view, FIG. 1(b) is a plan view showing a light receiving surface side, FIG. 1(c) is a plan view showing a rear surface side, and FIG. 1(d) is a cross sectional view along the line D-D in FIG. 1(b). In FIGS. 1(b) and 1(c), illustration of current collecting electrodes is omitted.

DESCRIPTION OF EMBODIMENTS

Hereinafter, with reference to the accompanying drawings, an example of the embodiments is described in detail. The shapes, dimensions and material qualities described below are examples for illustration, and the shapes, dimensions and material qualities are not limited to these. The following drawings are schematic diagrams for illustration, and the scales of the lengths, widths and heights are sometimes different from the lengths, widths and heights of the actual solar cell and the like. Specific scales of the lengths, widths and heights are determined in consideration of the following descriptions.

Figure 1:
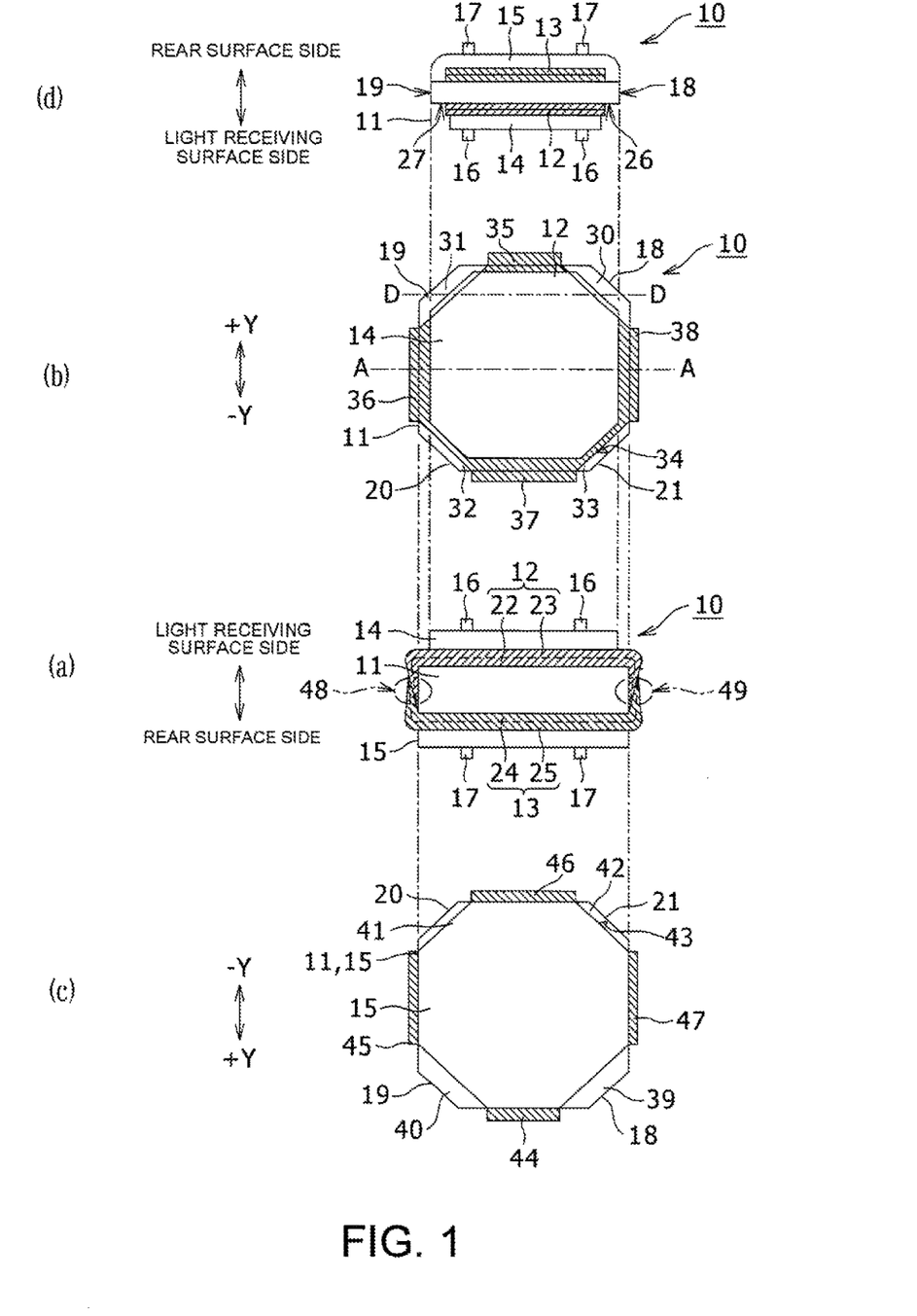

FIG. 1 is a diagram showing a solar cell 10. This solar cell 10 is based on an experimentally confirmed finding that a leak rarely occurs simply as a result of making an n-type amorphous semiconductor layer penetrate around to a side surface of a crystal substrate from one main surface side, and thereon making a p-type amorphous semiconductor layer penetrate around to the side surface of the crystal substrate from the other main surface side. In addition, it was confirmed that if a transparent conductive film is made to penetrate around to the side surface of the crystal substrate from one main surface side, and thereon a transparent conductive film is made to penetrate around to the side surface of the crystal substrate from the other main surface so as to overlap each other, the transparent conductive films snort with each other to generate a leak. Therefore, the re-type amorphous semiconductor layer on one main surface and the p-type amorphous semiconductor layer on the other main surface may be overlapped at the side surface of the crystal substrate, but the transparent conductive film on one main surface and the transparent conductive film on the other main surface are made to not overlap, which can prevent leakage occurrence while improving a power output. The following structure is based on this finding.

FIG. 1(a) is a cross sectional view. In FIG. 1(a), an upper side is a light receiving surface side, and a lower side is a rear surface side. FIG. 1(b) is a plan view showing the light receiving surface side, FIG. 1(c) is a plan view showing the rear surface side, and FIG. 1(d) is a cross sectional view along the line D-D in FIG. 1(b). Note that FIG. 1(d) is illustrated in a layout direction opposite to FIG. 1(a), that is, the upper side is the rear surface side and the lower side is the light receiving surface side. Further, FIGS. 1(b) and 1(c) are illustrated to be inverse up and down, and an upper-lower direction for layout is defined as a Y direction, which is distinguished by signs with the upper side being +Y direction in FIG. 1(b) and −Y direction in FIG. 1(c).

In this way, the cross sectional view varies depending on where to cut, and FIG. 1(a) corresponds to a cross sectional view along the line A-A in FIG. 1(b). Here, the "light receiving surface" refers to a surface in the solar cell 10 on which light is mainly incident front the outside. For example, more than 50% to 100% of the light incident on the solar cell 10 is incident from the light receiving surface side. Moreover, the "rear surface" refers to a surface opposite to the light receiving surface.

The solar cell 10 receives light such as sunlight, generates electrons and holes as carriers, collects the generated carriers, and collects and externally takes out a current from the collected carriers. A part generating the carriers is referred to as a photoelectric conversion part, which includes an n-type single-crystal silicon substrate 11, an n-type semiconductor layer 12, and a p-type semiconductor layer 13. Collection of the carriers is conducted by a transparent conductive film 14 on the light receiving surface side and a transparent conductive film 15 on the rear surface side. Current collection from the collected carriers is conducted by a current collecting electrode 16 on the light receiving surface side and a current collecting electrode 17 on the rear surface side. Hereinafter, the n-type single-crystal silicon substrate 11 is simply referred to as the crystal substrate 11.

The current collecting electrode 16 on the light receiving surface side is a current collecting electrode for carriers arranged on the transparent conductive film 14 on the light receiving surface side. The current collecting electrode 17 on the rear surface side is a current collecting electrode for carriers arranged on the transparent conductive film 15 on the rear surface side. These are each a thin wire-like electrode unit formed toy screen-printing on the transparent conductive films 14 and 15 in a desired pattern, for example, a conductive paste having conductive particles of silver (Ag) or the like dispersed in a binder resin. Alternatively, instead of the screen-printing, various sputtering methods, various vapor-deposition methods, various plating methods and the like may be used to form the current collecting electrodes 16 and 17. As shown in FIGS. 1(a) and 1(d), a plurality of the respective current collecting electrodes 16 and 17 may be arranged.

The present disclosure relates to the structures of the photoelectric conversion part and the transparent conductive films 14 and 15, and thus the description of the current collecting electrodes 16 and 17 is left in the above description and a diagrammatic representation thereof is shown only in FIGS. 1(a) and 1(d). Hereinafter, the respective structures are described in detail.

The crystal substrate 11 including the photoelectric conversion part is a single crystal semiconductor substrate having one conductivity type. Here, one conductivity type is assumed to be n-type, and the single crystal semiconductor is assumed to be single-crystal silicon. A planar shape of the crystal substrate 11 has, as shown in FIGS. 1(b) and 1(c), an octagonal shape obtained by cutting out four corner portions 18, 19, 20, and 21 at an outer edge of a rectangular shape. An example of the size is described as follows: one side is from about 100 mm to about 200 mm, and each of the four corners is cut out by a length along a direction of the side from about 5 mm to about 16 mm. In a case of the solar cell 10 of thin type, a thickness is from about 75 μm to about 200 μm, for example. These sizes are examples, and may have other values.

The n-type semiconductor layer 12 is a semiconductor layer of one conductivity type arranged on one main surface of the crystal substrate 11. If one main surface is the light receiving surface, one conductivity type is the conductivity type of the crystal substrate 11, therefore, the n-type semiconductor layer 12 is an n-type semiconductor layer arranged on the light receiving surface. The n-type semiconductor layer 12 includes an i-type amorphous silicon layer 22 and an n-type amorphous silicon layer 23 laminated on the layer 22.

The p-type semiconductor layer 13 is a semiconductor layer of the other conductivity type arranged on the other main surface of the crystal substrate 11. The other main surface, which is a main surface opposite to one main surface of the crystal substrate 11, is the rear surface of the crystal substrate 11 in the case of this embodiment. Additionally, one conductivity type is the conductivity type of the crystal substrate 11 and the other conductivity type is a conductivity type of other than the one conductivity type, and therefore a p-type semiconductor layer is arranged. The p-type semiconductor layer 13 includes an i-type amorphous silicon layer 24 and a p-type amorphous silicon layer 25 laminated on the layer 24. When the n-type semiconductor layer 12 and the p-type semiconductor layer 13 are distinguished, the former is called a first semiconductor layer and the latter is called a second semiconductor layer.

In FIG. 1(a), the n-type amorphous silicon layer 23, the i-type amorphous silicon layer 22, the crystal substrate 11, the i-type amorphous silicon layer 24, and the p-type amorphous silicon layer 25 are laminated in this order from the light receiving surface side toward the rear surface side. When the i-type amorphous silicon layers 22 and 24 are distinguished, the former is called a first i-type amorphous silicon layer and the latter is called a second i-type amorphous silicon layer. A thickness of each of these laminated amorphous semiconductor thin films is from several nm to several tens of nm. For example, the thickness may be about 5 to about 20 nm.

The i-type amorphous silicon layers 22 and 24 are each an intrinsic amorphous silicon thin film which is lower in a concentration of a dopant generating the carriers than the n-type amorphous silicon layer 23 and p-type amorphous silicon layer 25. The first i-type amorphous silicon layer 22 and the second i-type amorphous silicon layer 24 may have the same composition. The n-type amorphous silicon layer 23 is an amorphous silicon thin film containing metal atoms of Group V at a predetermined concentration. Examples of the metal atoms of Group V include P (phosphorus). The p-type amorphous silicon layer 25 is an amorphous silicon thin film containing Group III metal atoms at a predetermined concentration. Examples of the Group III metal atoms include B (boron).

The n-type semiconductor layer 12 is formed on an entire surface of the light receiving surface of the crystal substrate 11 except for locations corresponding to four corner portions 18, 19, 20, and 21 at the outer edge of the crystal substrate 11. The crystal substrate 11 is retained at a predetermined position in a film formation device in order to form the n-type semiconductor layer 12, and here it is assumed that the crystal substrate 11 is retained with the light receiving surface side being held at four corner portions 18, 19, 20, and 21 by four holders 26, 27, 28, and 29 (see FIG. 2). The four holders 26, 27, 28, and 29 may be a one piece holder.

The locations corresponding to four corner portions 18, 19, 20, and 21 of the crystal substrate 11, which are behind the holders 26, 27, 28, and 29, are non-film formation areas 30, 31, 32, and 33 where the n-type semiconductor layer 12 is not formed. Note that the holder 29 as one of four holders is provided with an identifying hole, and the n-type semiconductor layer 12 is formed at a location corresponding to the identifying hole to be an identifying mark 34.

Since other than the above areas is not behind the holders 26, 27, 28, and 29, the n-type semiconductor layer 12 is formed to be wrap around continuously from the light receiving surface of the crystal substrate 11 to the side surfaces, FIG. 1(b) shows wrapping around n-type semiconductor layers 35, 36, 37, and 38 which are formed on the side surfaces of the crystal substrate 11.

The p-type semiconductor layer 13 is formed on an entire surface of the rear surface of the crystal substrate 11 except for the locations corresponding to four corner portions 18, 19, 20, and 21 at the outer edge of the crystal substrate 11. The crystal substrate 11 is retained at a predetermined position in the film formation device in order to form the p-type semiconductor layer 13, and here it is assumed that four holders 26, 27, 28, and 29 used in forming the n-type semiconductor layer 12 are directly used to hold the rear surface side of the crystal substrate 11 at four corner portions 18, 19, 20, and 21. The locations corresponding to four corner portions 18, 19, 20, and 21 of the crystal substrate 11, which are behind the holders 26, 27, 28, and 29, are non-film formation areas 39, 40, 41, and 42 where the p-type semiconductor layer 13 is not formed. Note that an identifying mark 43 is formed by way of the p-type semiconductor layer 13 corresponding to the identifying hole provided to the holder 29.

Since other than the above areas is not behind the holders, the p-type semiconductor layer 13 is formed to be wrap around continuously from the rear surface of the crystal substrate 11 to the side surfaces, FIG. 1(c) shows wrapping around p-type semiconductor layers 44, 45, 46, and 47 which are formed on the side surfaces of the crystal substrate 11.

When the non-film formation areas 39, 40, 41, and 42 in the p-type semiconductor layer 13 and the non-film formation areas 30, 31, 32, and 33 in the n-type semiconductor layer 12 are distinguished, the latter are each called a first non-film formation area and the former are each called a second non-film formation area.

As shown in FIGS. 1(b) and 1(c), the non-film formation areas 30, 31, 32, and 33 in the n-type semiconductor layer 12 and the non-film formation areas 39, 40, 41, and 42 in the p-type semiconductor layer 13 respectively are to have an up-and-down inverse relationship with respect to the crystal substrate 11 in a case of no manufacturing error.

On the other hand, there are formed, on the side surfaces of the crystal substrate 11, the wrapping around n-type semiconductor layers 35, 36, 37, and 38 from the light receiving surface side, and the wrapping around p-type semiconductor layers 44, 45, 46, and 47 from the rear surface side. Therefore, there are formed, on the side surfaces of the crystal substrate 11, an overlapping layer where the wrapping around n-type semiconductor layer 35 and the wrapping around p-type semiconductor layer 44 overlap each other, an overlapping layer where the wrapping around n-type semiconductor layer 36 and the wrapping around p-type semiconductor layer 45 overlap each other, an overlapping layer where the wrapping around n-type semiconductor layer 37 and the wrapping around p-type semiconductor layer 46 overlap each other, and an overlapping layer where the wrapping around n-type semiconductor layer 38 and the wrapping around p-type semiconductor layer 47 overlap each other. FIG. 1(a) shows an overlapping layer 48 where the wrapping around n-type semiconductor layer 36 and the wrapping around p-type semiconductor layer 45 overlap each other, and an overlapping layer 49 where the wrapping around n-type semiconductor layer 38 and the wrapping around p-type semiconductor layer 47 overlap each other. According to an experimental result, it was found that formation of these overlapping layers has no effect on leakage.

The transparent conductive film 14 on the light receiving surface side is to be laminated on a first semiconductor layer over one main surface of the crystal substrate 11, and here, the transparent conductive film 14 on the light receiving surface side is laminated on the n-type semiconductor layer 12 or the n-type amorphous silicon layer 23 in the light receiving surface of the crystal substrate 11. The transparent conductive film 15 on the rear surface side, which is to be laminated on a second semiconductor layer over the other main surface of the crystal substrate 11, is laminated, here, on the type semiconductor layer 13 or the p-type amorphous silicon layer 25 on the rear surface of the crystal substrate 11. When the transparent conductive film 14 on the light receiving surface side and the transparent conductive film 15 on the rear surface side are distinguished, the former is called a first transparent conductive film and the latter is called a second conductive film.

In order to prevent leakage from occurring, two transparent conductive films 14 and 15 are required not to overlap each other on the side surfaces of the crystal substrate 11. For example, if at least any one of them is set to have area smaller than the planar shape of the crystal substrate 11, the other of them can have the same planar shape as the planar shape of the crystal substrate 11. In other words, even if the other transparent conductive film which has the same planar shape as the planar shape of the crystal substrate 11 is wrapping around to the side surface of the crystal substrate 11, it is not wrapping around to a surface opposite to the of the crystal substrate 11 and does not short with one transparent conductive film having an area smaller than the planar shape of the crystal substrate 11.

Which of the two transparent conductive films 14 and 15 is to have an area smaller than the planar shape of the crystal substrate 11 depends on performance such as carrier mobility of the semiconductor film where each transparent conductive film is arranged. Generally, the n-type semiconductor layer 12 has higher carrier mobility than the p-type semiconductor layer 13. Therefore, the area of the transparent conductive film 14 on the light receiving surface side is set to be smaller in planar size of the crystal substrate 11, and the area of the transparent conductive film 15 on the rear surface side is set to be the same planar size as the crystal substrate 11. This can prevent leakage while improving the output power of the solar cell 10.

Accordingly, the transparent conductive film 14 on the light receiving surface side is arranged at an inner side in an appropriate size and at an appropriate distance from the outer edge of the crystal substrate 11 as shown in FIG. 1(c). This size is set to a value minimized within a limitation that the size does not match up with an outer profile of the crystal substrate 11 even if all manufacturing errors are included. In other words, the transparent conductive film 14 is arranged independently from the non-film formation areas 30, 31, 32, and 33 in the n-type semiconductor layer 12. Therefore, if the non-film formation areas 30, 31, 32, and 33 are spread, the transparent conductive film 14 is provided on the non-film formation areas 30, 31, 32, and 33. In the example in FIG. 1(b), the transparent conductive film 14 is provided on the non-film formation areas 32 and 33. On the other hand, the transparent conductive film 15 on the rear surface side coincides with the planar shape of the crystal substrate 11. In other words, the transparent conductive film 15 is formed across the entire surface of the rear surface of the crystal substrate 11.

Such transparent conductive films 14 and 15 are each, for example, a thin film (TCO layer) configured to include at least one of metal oxides such as indium oxide ($In_2O_3$), zinc oxide (ZnO), tin oxide ($SnO_2$), titanium oxide ($TiO_2$) and the like which have a polycrystalline structure, and functions as a light transmissive electrode unit. In these metal oxides, a dopant may be doped such as tin (Sn), sine (Zn), tungsten (W), antimony (Sb), titanium (Ti), aluminum (Al), cerium (Ce), and gallium (Ga). A concentration of the dopant may be 0 to 20 mass %. A thickness of each of the transparent conductive films 14 and 15 is about 50 nm to 200 nm.

Figure 2:
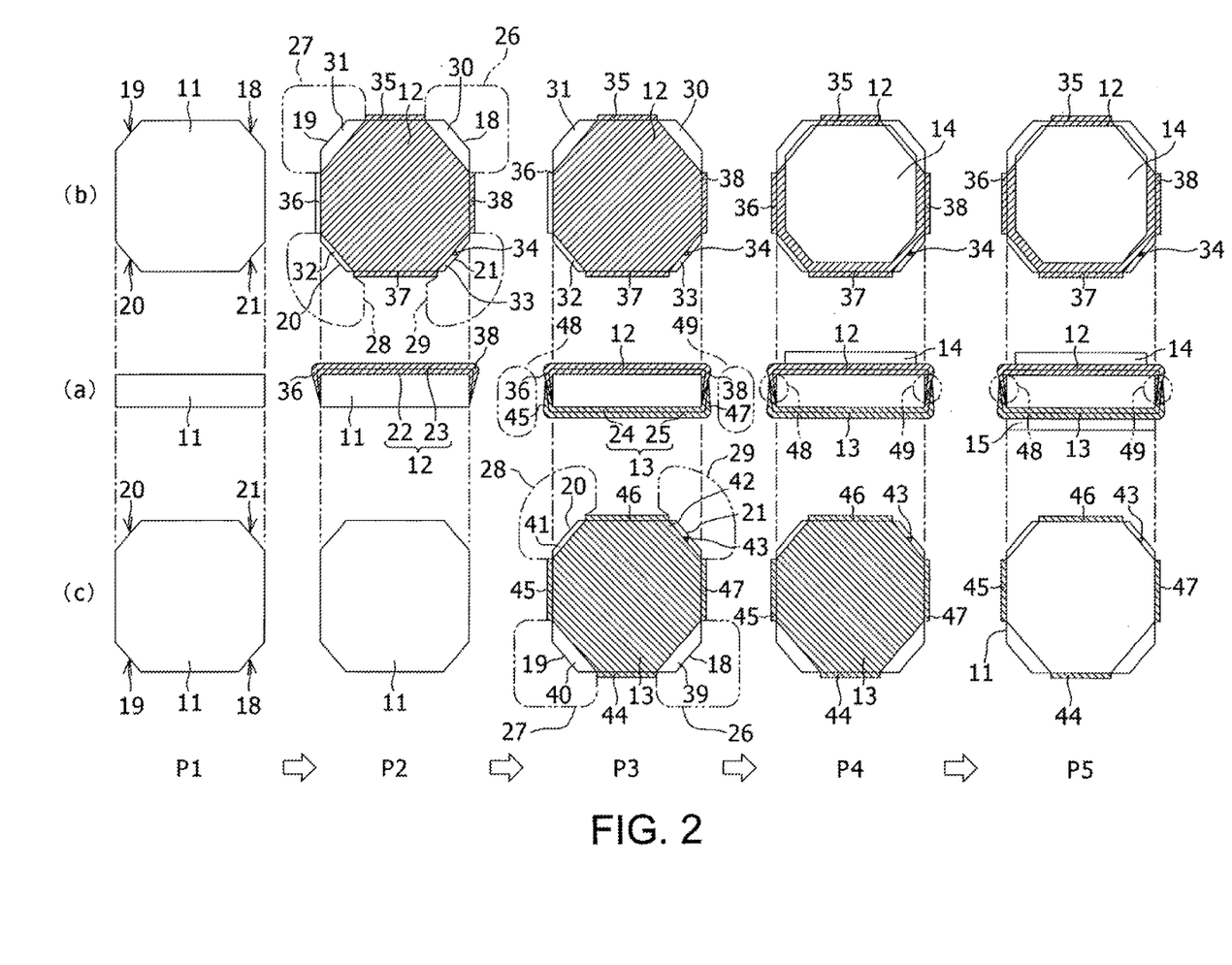
FIG. 2 is a diagram showing procedures for manufacturing the solar cell in FIG. 1, in which respective procedures are shown along a horizontal line, and shown along a vertical line are FIG. 2(a) as a cross sectional view, FIG. 2(b) as a light receiving surface side plan view, and FIG. 2(c) as a rear surface side plan view.

A description is given in detail of procedures for manufacturing the solar cell 10 like this with reference to FIG. 2. FIG. 2 shows steps before forming the current collecting electrodes 16 and 17 in the solar cell 10, that is, until the crystal substrate 11 is prepared (P1 step), the n-type semiconductor layer 12 is formed on the light receiving surface of the crystal substrate 11 (P2 step), the p-type semiconductor layer 13 is formed on the rear surface of the crystal substrate 11 (P3 step), the transparent conductive film 14 is formed on the light receiving surface side (P4 step), and the transparent conductive film 15 is formed on the rear surface side (P5 step). In FIG. 2, the respective procedures are shown along a horizontal line, and shown along a vertical line are FIG. 2(a) as a cross sectional view, FIG. 2(b) as a light receiving surface side plan view, and FIG. 2(c) as a rear surface side plan view which correspond to FIGS. 1(a) to 1(c), respectively.

At step P1, a clean crystal substrate 11 is prepared. The crystal substrate 11 is an n-type single-crystal silicon substrate having an octagonal shape obtained by cutting out four corner portions 18, 19, 20, and 21 at the outer edge of a rectangular shape.

At step P2, the n-type semiconductor layer 12 is formed on the light receiving surface the crystal substrate 11. Here, the crystal substrate 11 is set up in a decompression chamber with outer edges of four corner portions 18, 19, 20, and 21 on the light receiving surface side being retained by the predetermined holders 26, 27, 28, and 29. Then, the i-type amorphous silicon layer 22 is laminated on the light receiving surface of the crystal substrate 11 by, for example, a plasma-enhanced CVD (chemical vapor deposition) method. Subsequently, the n-type amorphous silicon layer 23 is laminated on the i-type amorphous silicon layer 22. Other low pressure CVD methods may be used instead of the plasma-enhanced CVD method. For example, a catalytic CVD method may be used.

At a step of laminating the i-type amorphous silicon layer 22, a silane gas ($SiH_4$) is used as a material gas. At a step of laminating the n-type amorphous silicon layer 23, silane ($SiH_4$), hydrogen ($H_2$), and phosphine ($PH_3$) are used as a material gas. A thickness of the laminated amorphous semiconductor thin film is several nm to several tens of nm. For example, the thickness may be about 5 to 20 nm.

Retaining is done in a manner of supporting by way of a holder such as a pin or a mask with respect to the crystal substrate 11. For example, the crystal substrate 11 is put on a sub tray, the outer edges of four corner portions 18, 19, 20, and 21 of the crystal substrate 11 are held by the holders 26, 27, 28, and 29, and the sub tray is inclined from a horizontal plane at a predetermined angle. The predetermined angle may be, for example, 90 degrees, that is, perpendicular. In addition, four holders 26, 27, 28, and 29 may be attached to one sub tray, and four holders 26, 27, 28, and 29 which are integrated into one body may be attached to one sub tray. Further, a plurality of sub trays may be located on one larger tray such that a plurality of crystal substrates 11 are collectively processed.

Retained sizes at the outer edge for four corner portions 18, 19, 20, and 21 of the crystal substrate 11 may be different from each other. For example, in a case where the crystal substrate 11 is erected in a vertical direction, the retained sizes at the corner portions 18 and 19 are desirably made larger than the retained sizes at the corner portions 20 and 21 as shown in FIG. 2.

In this way, the n-type semiconductor layer 12 is formed at the locations in the light receiving surface of the crystal substrate 11 that are not behind the holders 26, 27, 28, and 29. The locations behind the holders 26, 27, 28, and 29 correspond to the non-film formation areas 30, 31, 32, and 33, respectively.

The n-type semiconductor layer 12, which is formed at the locations not behind the holders 26, 27, 28, and 29, is continuously formed on the light receiving surface and side surfaces of the crystal substrate 11. On the side surfaces of the crystal substrate 11, the wrapping around n-type semiconductor layers 35, 36, 37, and 38 are formed. Moreover, the holder 29 is provided with, for example, a triangle identifying hole, corresponding to which the identifying mark 34 of a triangle area is formed in the non-film formation area 33 by way of the n-type semiconductor layer 12.

After step P2 ends, then, at step P3 the p-type semiconductor layer 13 is formed. In forming the p-type semiconductor layer 13, the crystal substrate 11 having the n-type semiconductor layer 12 formed thereon is turned over, and is set up in a decompression chamber with the outer edges of four corner portions 18, 19, 20, and 21 on the rear surface side of the crystal substrate 11 being retained by the predetermined holders. Examples of the decompression chamber to be used include a CVD device having the same form as used in step P2.

Then, the i-type amorphous silicon layer 24 is laminated on the rear surface of the crystal substrate 11. Subsequently, the p-type amorphous silicon layer 25 is laminated on the i-type amorphous silicon layer 24. At a step of laminating the i-type amorphous silicon layer 24, a silane gas ($SiH_4$) is used as a material gas. In a step of laminating the p-type amorphous silicon layer 25, silane ($SiH_4$), hydrogen ($H_2$), and diborane ($B_2H_6$) are used as a material gas. A thickness of the laminated amorphous semiconductor thin film is several nm to several tens nm. For example, the thickness may be about 5 to 20 nm.

As for the holder, the holders 26, 27, 28, and 29 used at step P2 can be used directly. Another different holder but having the same shape and size as that used at P2 step may be used. When the same holders 26, 27, 28, and 29 are used at P2 step and P3 step, the holders 26, 27, 28, and 29 are arranged in an up-and-down inverse relationship with respect to the crystal substrate 11.

In this way, the p-type semiconductor layer 13 is formed at the locations in the rear surface of the crystal substrate 11 that are not behind the holders 26, 27, 28, and 29. The locations behind the holders 26, 27, 28, and 29 correspond to the non-film formation areas 39, 40, 41, and 42, respectively.

The p-type semiconductor layer 13, which is formed at the locations not behind the holders 26, 27, 28, and 29, is continuously formed on the side surfaces and light receiving surface of the crystal substrate 11. On the side surfaces of the crystal substrate 11, the wrapping around p-type semiconductor layers 44, 45, 46, and 47 are formed. Moreover, corresponding to the identifying hole provided to the holder 29, the identifying mark 43 of a triangle area is formed in the non-film formation area 42 by way of the p-type semiconductor layer 13. The identifying mark 43 is formed at a position against the identifying mark 34 formed at P2 step in an up-and-down inverse relationship with respect to the crystal substrate 11.

There are formed, on the side surfaces of the crystal substrate 11, the wrapping around n-type semiconductor layers 35, 36, 37, and 38 at step P2, and then, the wrapping around p-type semiconductor layers 44, 45, 46, and 47 at step P3. Therefore, on the side surfaces of the crystal substrate 11, at least a part of the wrapping around n-type semiconductor layer overlaps the wrapping around n-type semiconductor layer. FIG. 2 shows the overlapping layer 48 where the wrapping around n-type semiconductor layer 36 and the wrapping around p-type semiconductor layer 45 overlap each other, and an overlapping layer 49 where the wrapping around n-type semiconductor layer 38 and the wrapping around p-type semiconductor layer 47 overlap each other.

After step P3, the transparent conductive film 14 on the light receiving surface side is formed (step P4). Here, a sputtering system is used, and the film formation is performed in such a state that the n-type semiconductor layer 12 on the light receiving surface side of the crystal substrate 11 is arranged so as to face a sputtering electrode and a frame-shaped mask having an opening area smaller than the planar shape of the crystal substrate 11 is positioned on the light receiving surface side. Positioning of the frame-shaped mask is performed such that when an opening of the frame-shaped mask is put at the center of the crystal substrate 11, an inner edge end of the opening of the frame-shaped mask is at an inner side from an outer edge end of the crystal substrate 11. This allows the non-film formation area in the transparent conductive film 14 to be formed circularly on an outer periphery side of the light receiving surface. A width of the non-film formation area is set to a value minimized within a limitation that the width does not match up with an outer profile of the crystal substrate 11 even when all the manufacturing errors are included. For example, the width is about 1 to 2 mm.

Next, at step P5, transparent conductive film 15 on the rear surface side is formed. Here, the film formation is performed in such a state that the crystal substrate 11 having the transparent conductive film 14 on the light-receiving surface side formed thereon is turned over, and the p-type semiconductor layer 13 on the rear surface side of the crystal substrate 11 is arranged so as to face a sputtering electrode. The sputtering system having the sputtering electrode to be used may be those having the same form as used at step P4. Unlike at step P4, the mask is not used, and thus the transparent conductive film 15 is formed on an entire surface of the p-type semiconductor layer 13.

Since, to the side surfaces of the crystal substrate 11, the transparent conductive film 15 on the rear surface side is wrapping around in some cases, but the transparent conductive film 14 the on the light receiving surface side is not wrapping around, there occurs no leakage caused by shorting between the transparent conductive film 14 and the transparent conductive film 15.

Figure 3:
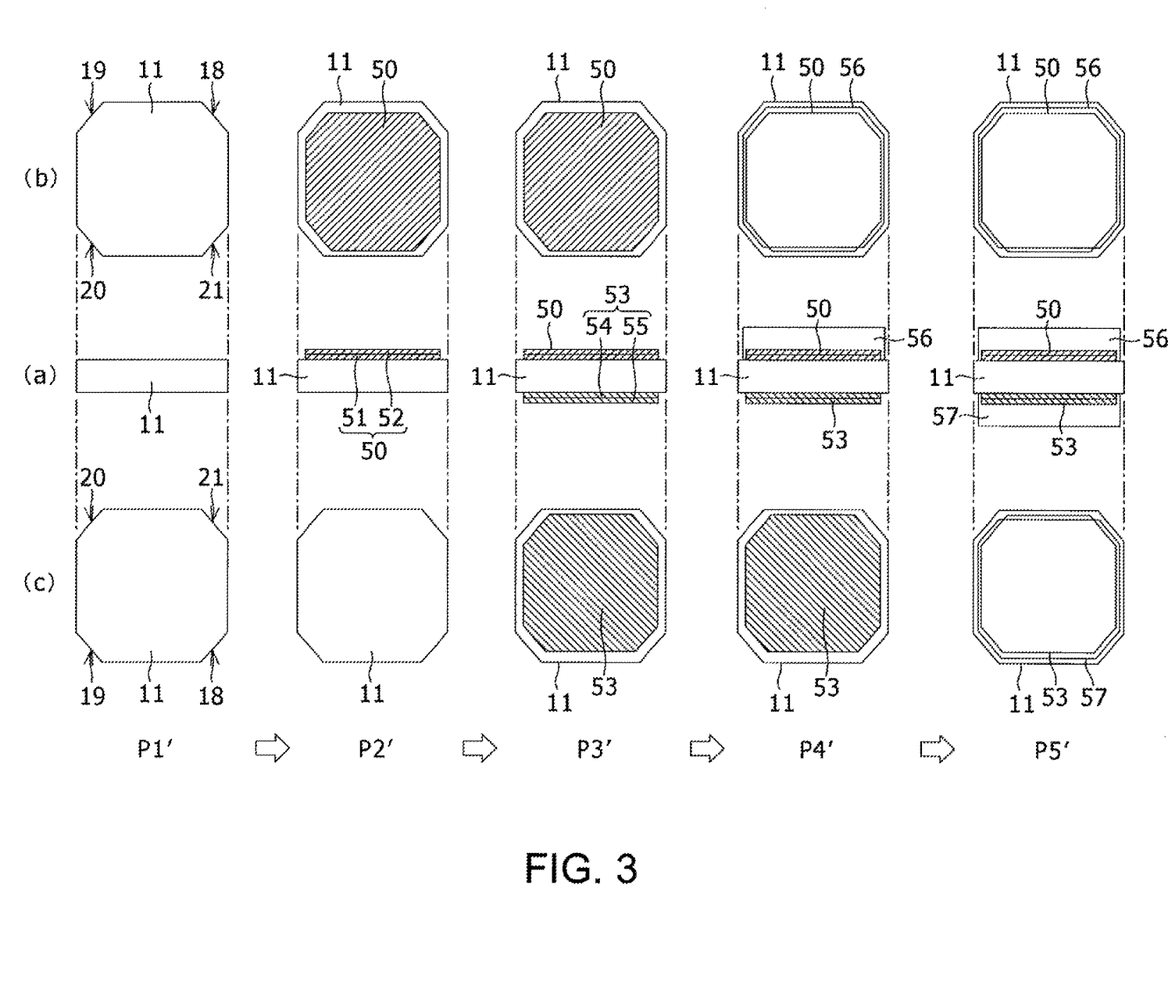
FIG. 3 is a diagram showing procedures for manufacturing a solar cell of related art illustrated corresponding to those in FIG. 2.

FIG. 3 is a diagram showing procedures for manufacturing a solar cell of related art which is constructed so as not to generate leakage. In FIG. 3, shown along a vertical line are FIG. 3(a) as a cross sectional view, FIG. 3(b) as a light receiving surface side plan view, and FIG. 3(c) as a rear surface side plan view which correspond to FIGS. 2(a) to 2(c), respectively. Along a horizontal line the respective procedures are shown in which P1' to P5' correspond to P1 to P5 in FIG. 2, respectively. A film forming condition for each procedure has the same content as that described in FIG. 2, except for dimensions of the film formation area at P2 to P4. Therefore, a description is given hereinafter of the content of the film formation area different from FIG. 2, and a description of other common contents with FIG. 2 is omitted.

Step P1' in FIG. 3 is a step of preparing the crystal substrate 11 similarly to step P1 in FIG. 2. Step P2' is a step of forming the n-type semiconductor layer 50. The n-type semiconductor layer 50 is formed in such a way that i-type amorphous silicon layer 51 is laminated on the light receiving surface of the crystal substrate 11, and subsequently, the n-type amorphous silicon layer 52 is laminated on the i-type amorphous silicon layer 51. This content is the same as that described in FIG. 2. A different point is that the dimensions of the film formation area in the n-type semiconductor layer 50 have an area smaller than the planar shape of the crystal substrate 11. In other words, a frame-shaped mask having an opening area smaller than the planar shape of the crystal substrate 11 is used to form the n-type semiconductor layer 50. A portion covered by the frame-shaped mask is the non-film formation area in the n-type semiconductor layer 50, which is formed circularly on an outer periphery side of the light receiving surface. A width dimension of the non-film formation area is uniform from the outer edge end of the crystal substrate 11, and is about 0.3 to 3 mm, for example. This is an example, and other dimensions than this may be taken.

Step P3' is a step of forming the p-type semiconductor layer 53. The p-type semiconductor layer 53 is formed in such a way that i-type amorphous silicon layer 54 is laminated on the rear surface of the crystal substrate 11, and subsequently, the p-type amorphous silicon layer 55 is laminated on the i-type amorphous silicon layer 51. This content is the same as that described in FIG. 2. A different point is that the dimensions of the film formation area in the p-type semiconductor layer 53 have an area smaller than the planar shape of the crystal substrate 11. In other words, a frame-shaped mask having an opening area smaller than the planar shape of the crystal substrate 11 is used to form the p-type semiconductor layer 53. The frame-shaped mask to be used may be one having the same opening area as used in P2' step. A portion covered by the frame-shaped mask is the non-film formation area in the p-type semiconductor layer 53, which is formed circularly on an outer periphery side of the rear surface. A width of the non-film formation area is the same as the width of the non-film formation area in the n-type semiconductor layer 50.

In this way, both the dimensions of the film formation area in the n-type semiconductor layer 50 and the dimensions of the film formation area in the p-type semiconductor layer 53 are set to have an area smaller than the planar shape of the crystal substrate 11. Therefore, since, to the side surfaces of the crystal substrate 11, no n-type semiconductor layer 50 is wrapping around and no p-type semiconductor layer 53 is wrapping around, there occurs no leakage caused by the n-type semiconductor layer 50 or the p-type semiconductor layer 53 being wrapping around.

Step P4' is a step of forming the transparent conductive film 56 on the light receiving surface side. The film forming conditions or the like at this step is the same as those at step P4 in FIG. 2. A different point is the film formation area in the transparent conductive film 56 on the light receiving surface side. An area of the transparent conductive film 56 on the light receiving surface side is smaller than the planar shape of the crystal substrate 11 and larger than an area of the film formation area in the n-type semiconductor layer 50. In other words, the transparent conductive film 56 on the light receiving surface side fully covers the film formation area in the n-type semiconductor layer 50, but the outer edge end thereof is at an inner side from the outer edge end of the crystal substrate 11.

Step P5' is a step of forming the transparent conductive film 57 on the rear surface side. The film forming conditions or the like at this step are the same as those at step P5 in FIG. 2. A different point is the film formation area in the transparent conductive film 57 on the rear surface side. An area of the transparent conductive film 57 on the rear surface side is the same as the area of the transparent conductive film 56 on the light receiving surface side. In other words, the area of the transparent conductive film 57 on the rear surface side is smaller than the planar shape of the crystal substrate 11 and larger than an area of film formation area in the p-type semiconductor layer 53. In other words, the transparent conductive film 57 on the rear surface side fully covers the film formation area in the p-type semiconductor layer 53, but the outer edge end thereof is at an inner side from the outer edge end of the crystal substrate 11.

In this way, both the dimensions of the film formation area in the transparent conductive film 56 on the light receiving surface side and the dimensions of the film formation area in the transparent conductive film 57 on the rear surface side are set to have an area smaller than the planar shape of the crystal substrate 11. Therefore, since, to the side surfaces of the crystal substrate 11, no transparent conductive film 56 on the light receiving surface side is wrapping around and no transparent conductive film 57 on the rear surface side is wrapping around, there occurs no leakage caused by the transparent conductive film 56 on the light receiving surface side or the transparent conductive film 57 on the rear surface side being wrapping around.

In the case of the structure shown in FIG. 3, no leakage occurs, but the number of carriers capable of being collected depends on the area of the n-type semiconductor layer 50 and the area of the p-type semiconductor layer 53, and therefore, the output power as the solar cell is deteriorated compared to the case of the structure in FIG. 2 in which the crystal substrate 11 having the same dimensions is used. In contrast to this, the structure in FIG. 2 can prevent leakage from occurring while maximizing the number of carriers capable of being collected, leading to improvement of the output power of the solar cell 10.

The above description describes, as an example, the photoelectric conversion part having the structure in which the amorphous silicon thin film is laminated on both sides of the crystal substrate 11, but the structure of the photoelectric conversion part is not limited thereto. The photoelectric conversion part may also have, for example, a structure in which the i-type amorphous silicon layer, the n-type amorphous silicon layer, or the p-type amorphous silicon layer is not included, and a structure in which a semiconductor made of other than silicon (e.g., gallium arsenide) is used. Mote that the amorphous silicon in this embodiment also includes amorphous silicon containing crystal grains.

In addition, in the above description, one conductivity type is assumed to be the n-type and the other conductivity type is assumed to be the p-type, but inversely to this, one conductivity type may be the p-type and the other conductivity type may be the n-type. Further, one main surface is assumed to be the light receiving surface and the other main surface is assumed to be the rear surface, but inversely to this, one main surface may be the rear surface and the other main surface may be the light receiving surface.

Moreover, the crystal substrate is assumed to be octagonal, obtained by cutting out four corners, but may be a rectangular shape from which four corners are not cut out, a polygonal shape other than an octagon, or a round shape or ellipsoidal shape other than a rectangular shape. Additionally, one identifying mark is assumed to be arranged on each of both the light receiving surface and the rear surface, but the identifying mark may be arranged on only any one of the light receiving surface or the rear surface, and a plurality of identifying marks, that is more than one, may be arranged. The shape of the identifying mark is assumed to be a triangle, but may be other shapes than this. For example, a plurality of elongated holes like a barcode may be used.

In addition, the above embodiment, uses the structure in which four corner portions 18, 19, 20, and 21 of the crystal substrate 11 are retained, but a structure is sufficient so long as at least one portion of the crystal substrate 11 is retained. For example, a structure may be used in which two portions of the crystal substrate 11, the corner portions 18 and 19, are retained.

REFERENCE SIGNS LIST 10 solar cell, 11 crystal substrate, 12, 50 n-type semiconductor layer, 13, 53 p-type semiconductor layer, 14, 15, 56, 57 transparent conductive film, 16, 17 current collecting electrode, 18, 19, 20, 21 corner portion, 22, 24, 51, 54 i-type amorphous silicon layer, 23, 52 n-type amorphous silicon layer, 25, 55 p-type amorphous silicon layer, 26, 27, 28, 29 holder, 30, 31, 32, 33, 39, 40, 41, 42 non-film formation area, 34, 43 identifying mark, 35, 36, 37, 38 wrapping around n-type semiconductor layer, 44, 45, 46, 47 wrapping around p-type semiconductor layer, 48, 49 overlapping layer

The invention claimed is:
1. A solar cell, comprising:
a crystal substrate which has n-type conductivity;
a first semiconductor layer which is laminated on a first main surface of the crystal substrate and a side surface of the crystal substrate, the first main surface of the crystal substrate being on a light receiving surface side, the first semiconductor layer having the n-type conductivity;
a second semiconductor layer which is laminated on a second main surface of the crystal substrate and the side surface of the crystal substrate, at least a part of the second semiconductor layer overlapping the first semiconductor layer at the side surface of the crystal substrate, the second semiconductor layer having p-type conductivity, wherein the second semiconductor layer has an area smaller than a planar shape of the crystal substrate on the second main surface;
a first transparent conductive film which is laminated on the first semiconductor layer and areas of the crystal substrate in which the first semiconductor layer is absent over the first main surface of the crystal substrate, wherein the first transparent conductive film has an area smaller than a planar shape of the crystal substrate; and
a second transparent conductive film which is laminated on the second semiconductor layer.

2. The solar cell according to claim 1, wherein
the crystal substrate has an octagonal shape obtained by cutting out four corner portions of a rectangular shape, and
first non-layer formation areas and second non-layer formation areas are respectively arranged at the four corner portions.

3. The solar cell according to claim 2, wherein
the first transparent conductive film is arranged on the first non-layer formation areas and the second transparent conductive film is arranged on the second non-layer formation areas.

4. The solar cell according to claim 1, wherein
the first semiconductor layer has a first i-type amorphous semiconductor layer and a first conductivity type amorphous semiconductor layer laminated therein in this order, and
the second semiconductor layer has a second i-type amorphous semiconductor layer and a second conductivity type amorphous semiconductor layer laminated therein in this order.

5. The solar cell according to claim 2, wherein
an identifying mark is formed in at least one of the first non-layer formation areas or the second non-layer formation areas.

* * * * *